US005853928A

United States Patent [19]

Kim

[11] Patent Number: 5,853,928

[45] Date of Patent: Dec. 29, 1998

[54] METHOD FOR FORMING BRAUN TUBE'S FLUORESCENT LAYER

[75] Inventor: Min-Ho Kim, Suwon, Rep. of Korea

[73] Assignee: Samsung Display Devices Co., Ltd., Kyungki-do, Rep. of Korea

[21] Appl. No.: 573,746

[22] Filed: Dec. 18, 1995

[30] Foreign Application Priority Data

Dec. 26, 1994 [KR] Rep. of Korea .......................... 94-36915

[51] Int. Cl.[6] .............................. G03F 7/26; G03F 7/012; G03F 7/021; G03G 15/045

[52] U.S. Cl. ................................ 430/28; 430/62; 430/63; 430/160; 430/167; 430/175; 430/176; 430/196; 430/197

[58] Field of Search .............................. 430/28, 197, 175, 430/176, 62, 63, 160, 167, 196, 23, 29

[56] References Cited

U.S. PATENT DOCUMENTS

| | | | |
|---|---|---|---|
| 4,332,874 | 6/1982 | Hayashi et al. | 430/28 |
| 4,425,419 | 1/1984 | Sasaya et al. | 430/28 |
| 4,501,806 | 2/1985 | Watanabe et al. | 430/28 |
| 4,526,854 | 7/1985 | Watanabe et al. | 430/28 |
| 4,921,767 | 5/1990 | Datta et al. | 430/23 |
| 4,954,418 | 9/1990 | Koike | 430/28 |
| 5,229,234 | 7/1993 | Riddle et al. | 430/28 |
| 5,474,867 | 12/1995 | Ritt et al. | 430/28 |
| 5,575,953 | 11/1996 | Tachizono et al. | 252/504 |

*Primary Examiner*—John S. Chu
*Attorney, Agent, or Firm*—Lowe Hauptman Gopstein Gilman & Berner

[57] ABSTRACT

A method for electrophotographically forming a Braun tube's fluorescent layer coats conductive and photoconductive layers on the internal surface of a Braun tube's panel. The photoconductive layer is formed of a water soluble photoconductive liquid including a water soluble binder, allowing a part of the photoconductive layer to be selectively exposed to a visible ray. The photoresist of the above photoconductive liquid is substituted with dye, which can be processed through general exposure and solvent, allowing the fluorescent layer to be formed on a Braun tube under the same conditions as a typical Braun tube production process without darkroom processing.

14 Claims, No Drawings

METHOD FOR FORMING BRAUN TUBE'S FLUORESCENT LAYER

BACKGROUND OF THE INVENTION

1. Field of the Invention

The present invention relates in general to a method for forming a Braun tube's fluorescent layer. More particularly, the invention relates to a method for electrophotographically forming the Braun tube's fluorescent layer by coating conductive and photoconductive layers on the internal surface of a Braun tube's panel and selectively exposing the photoconductive layer to a visible ray thereby forming a fluorescent layer on the panel's internal surface owing to the characteristics of frictional electricity.

2. Description of the Prior Art

To electrophotographically form a Braun tube's fluorescent layer in the prior art, conductive and photoconductive layers are successively coated on the internal surface of a Braun tube's panel. The conductive material for the conductive layer may be selected from either a group of inorganic conductive materials such as tin oxides, indium oxides and indium-tin oxides or a group of organic conductive materials. Particularly, U.S. Pat. No. 4,921,767 proposes an aqueous solution including 10 wt % of polybrene and 10% of prophenol suitable to be used as the conductive material.

The photoconductive layer coated on the conductive layer is formed of a photoconductive material which not only acts as an insulating layer in the dark, but also emits either electrons or holes to show its electrical characteristics when it is applied with any light having a given wavelength, such as ultraviolet or infrared rays. Typically, the photoconductive material for the photoconductive layer includes dye and solvent, the dye being a volatile organic polymer. The representative binder of the photoconductive material is, for example, polyvinyl carbazole and polymethyl methacrylate. The dye of the photoconductive material is selected from the group of crystal violet, chloridine blue and rhodamine 6G. The solvent of the photoconductive material is selected from the group of chlorobenzene and cyclopentanone. In the photoconductive liquid for the photoconductive layer, 200 g of polyvinyl carbazole and 10 g of polymethyl methacrylate, a dye including 0.1–0.4 wt % of chloridine blue and 3800 g of chlorobenzene are used as the binder, photoresist and solvent respectively. Application of the photoconductive material on the conductive layer is followed by a spin coating and drying process. As a result of the spin coating and drying process, the photoconductive layer of 214 6 $\mu$m thickness is formed on the conductive layer.

The above photoconductive layer is charged with a voltage of +200–+400 V with a typical corona discharger in a darkroom. The photoconductive layer in turn is exposed to a xenon lamp while inserting S/M. As a result of the above exposure, a part of the photoconductive layer, which will be deposited with a fluorescent material thereon, discharges electricity. When the photoconductive layer after the above exposure is applied with a fluorescent material, having cation frictional electricity by a developing device, the desired fluorescent layer is formed on the Braun tube.

As neither the dye nor the binder of the above photoconductive material is dissolved in water, they have to be dissolved in organic solvent, such as chlorobenzene or cyclopentanone. However, the above organic solvent may contaminate the processing environment thereby causing environmental pollution. Additionally, as the dye of the photoconductive material absorbs light having a wavelength of about 700 nm, the process for forming the photoconductive layer has to be performed in a darkroom. This makes the photoconductive layer forming process somewhat difficult.

SUMMARY OF THE INVENTION

It is, therefore, an object of the present invention to electrophotographically form a Braun tube's fluorescent layer in which the above problems can be overcome. The method of the invention coats the conductive and photoconductive layers on the internal surface of a Braun tube's panel, the photoconductive layer being formed of water soluble photoconductive liquid including a water soluble binder thereby allowing a part of the photoconductive layer to be selectively exposed to a visible ray. The photoresist of the above photoconductive liquid is substituted with dye, which can be processed through general exposure, and solvent, thereby allowing the fluorescent layer to be formed on a Braun tube in the same condition of a typical Braun tube production process other than in a darkroom.

In order to accomplish the above object, the present invention provides a method for forming a Braun tube's fluorescent layer by electrophotographically coating conductive and photoconductive layers on an internal surface of a Braun tube's panel, wherein a photoconductive material for the photoconductive layer comprises water soluble polyacetone acrylamide as a binder, balance of water as a solvent for the binder, 4-diazo diphenylamine ½ zincchloride formaldehyde as a dye, and 4-4'-diazido stilbene 2,2'-disulfonic acid sodium salt as a solvent for the dye.

The above photoconductive material further comprises a small amount of surface active agent used for reducing surface tension while coating the photoconductive material on the internal surface of the Braun tube's panel.

DESCRIPTION OF THE PREFERRED EMBODIMENTS

In a primary embodiment of this invention, a conductive layer is formed on the internal surface of a Braun tube's panel prior to coating a photoconductive layer on the conductive layer. The photoconductive material for the photoconductive layer includes 10 wt % of water soluble polyacetone acrylamide as a binder, a balance of water as solvent for the binder, a dye of 0.1 wt % of 4-diazo diphenylamine ½ zincchloride formaldehyde as photoresist, and 0.3 wt % of 4-4'-diazido stilbene 2,2'-disulfonic acid sodium salt as solvent for the dye. The photoconductive material further includes a small amount of surface active agent used for reducing the surface tension of the photoconductive layer while coating the photoconductive material on the internal surface of the Braun tube's panel.

In a second embodiment, the photoconductive material for the photoconductive layer includes 10 wt % of polyacetone acrylamide as the binder, balance of water as the solvent for the binder, a dye of 0.2 wt % of 4-diazo diphenylamine ½ zincchloride formaldehyde as photoresist, and 0.2 wt % of 4-4'-diazido stilbene 2,2'-disulfonic acid sodium salt as the solvent for the dye. The photoconductive material further includes a small amount of surface active agent used for reducing the surface tension of the photoconductive layer while coating the photoconductive material on the internal surface of the Braun tube's panel.

The process for forming the Braun tube's fluorescent layer will be described in detail, below.

The internal surface of the Braun tube's panel is washed prior to coating the conductive layer on the panel internal surface. The conductive layer may be formed of an inorganic conductive material. However, it is preferable to form the conductive layer out of an organic conductive material as organic material shows an excellent thermal decomposition performance while performing a plastic process for the conductive layer.

Thereafter, the photoconductive liquid is coated on the conductive layer thus forming the photoconductive layer on the Braun tube's panel. The photoconductive liquid includes pure water as the solvent and polyacetone acrylamide as the binder. The photoresist of the above photoconductive liquid is a mixture resulting from mixing 4-diazo diphenylamine ½ zincchloride formaldehyde having absorption wavelength of 350–400 nm with 4-4'-diazido stilbene 2,2'-disulfonic acid sodium salt into a given mixing ratio. As the photoresist of the above photoconductive liquid uses the above mixture, the photoresist not only generates electrons, but also transmits the electrons in the photoconductive layer.

In the present invention, it is preferred to add 0.1–0.5 wt % of photoresist to the above photoconductive liquid and to let the photoconductive liquid maintain a viscosity of 4–8 cps at a temperature of 25° C.

The above photoconductive liquid is coated on the conductive layer through a typical spin or spray coating process. In this case, the photoconductive layer preferably has a thickness of 10–20 μm. However, as the photoconductive liquid generates a large amount of gas while it is processed by a plastic process, the photoconductive layer also may have 3–10 μm thickness.

When the small amount of surface active agent is added to the photoconductive liquid as described above, the surface tension of the photoconductive layer is desirably reduced.

As described above, the method for forming Braun tube's fluorescent layers according to the present invention prevents environmental contamination caused by the organic solvent used in the typical method for electrophotographically forming the fluorescent layer. The method of this invention thus prevents any environmental pollution. The instant method also completely removes the problem forming the fluorescent layer in a darkroom. This method makes producing the Braun tubes much easier.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a Braun tube's fluorescent layer comprising the steps of (a) electrophotographically coating conductive and photoconductive layers on an internal surface of a Braun tube's panel with a photoconductive material for said photoconductive layer comprising:

a water soluble polyacetone acrylamide as a binder;

a balance of water as a solvent for said binder;

4-diazo diphenylamine ½ zincchloride formaldehyde as a dye; and 4-4'-diazido stilbene 2,2'-disulfonic acid sodium salt as a solvent for said dye;

wherein said photoconductive material comprises 10 wt % of polyacetone acrylamide as said binder, a balance of water as said solvent for said binder, said dye of 0.1 wt % of 4-diazo diphenylamine ½ zincchloride formaldehyde, and 0.3 wt % of 4-4'diazido stilbene 2,2'-disulfonic acid sodium salt as said solvent for said dye;

(b) selectively exposing at least a part of said photoconductive layer to a visible ray; and (c) developing said photoconductive material to form said fluorescent layer.

2. A method for forming a Braun tube's fluorescent layer comprising the steps of (a) electrophotographically coating conductive and photoconductive layers on an internal surface of a Braun tube's panel with a photoconductive material for said photoconductive layer comprising:

a water soluble polyacetone acrylamide as a binder;

a balance of water as a solvent for said binder;

4-diazo diphenylamine ½ zincchloride formaldehyde as a dye; and 4-4'-diazido stilbene 2,2'-disulfonic acid sodium salt as a solvent for said dye;

wherein said photoconductive material comprises 10 wt % of polyacetone acrylamide as said binder, balance of water as said solvent for said binder, said dye of 0.2 wt % of 4-diazo diphenylamine ½ zincchloride formaldehyde, and 0.2 wt % of 4-4'diazido stilbene 2,2'-disulfonic acid sodium salt as said solvent for said dye;

(b) selectively exposing at least a part of said photoconductive laver to a visible ray; and (c) developing said photoconductive material to form said fluorescent layer.

3. The method according to claim 1, wherein said photoconductive material has a viscosity of 4–8 cps at 25° C.

4. The method according to claim 1, wherein said photoconductive material further comprises a small amount of surface active agent used for reducing the surface tension while coating said photoconductive material on said internal surface of the Braun tube's panel.

5. The method of claim 1, wherein the developing step (c) occurs without dark room processing.

6. The method of claim 2, wherein the developing step (c) occurs without dark room processing.

7. The method of claim 1, wherein step (a) utilizes a spin or spray coating process.

8. The method of claim 7, wherein said photoconductive material has a coating thickness of 10–20 micrometers.

9. The method of claim 7, wherein said photoconductive material has a coating thickness of 3–10 micrometers.

10. The method of claim 7, wherein step (a) utilizes a spin or spray coating process.

11. The method of claim 10, wherein said photoconductive material has a coating thickness of 10–20 micrometers.

12. The method of claim 10, wherein said photoconductive material has a coating thickness of 3–10 micrometers.

13. The method of claim 1, wherein step (a) occurs without photoresist.

14. The method of claim 2, wherein step (a) occurs without photoresist.

* * * * *